(12) United States Patent
Wei

(10) Patent No.: US 8,248,792 B2
(45) Date of Patent: Aug. 21, 2012

(54) CONTAINER DATA CENTER AND AIR INTAKE APPARATUS

(75) Inventor: Chao-Ke Wei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 70 days.

(21) Appl. No.: 12/894,172

(22) Filed: Sep. 30, 2010

(65) Prior Publication Data

US 2012/0063087 A1 Mar. 15, 2012

(30) Foreign Application Priority Data

Sep. 14, 2010 (TW) ................................. 99131111 A

(51) Int. Cl.
*H05K 7/20* (2006.01)
(52) U.S. Cl. ............... 361/692; 361/679.46; 361/679.51; 361/695; 361/701; 181/264; 181/277; 181/283; 454/184; 312/223.1
(58) Field of Classification Search ........ 361/679.46–679.51, 688–703
See application file for complete search history.

(56) References Cited

U.S. PATENT DOCUMENTS

| 5,332,872 | A | * | 7/1994 | Ewanek | 181/224 |
| 7,562,742 | B2 | * | 7/2009 | Gilliland et al. | 181/280 |
| 2007/0139882 | A1 | * | 6/2007 | Bartell et al. | 361/695 |
| 2007/0297159 | A1 | * | 12/2007 | Gilliland | 361/818 |
| 2008/0291626 | A1 | * | 11/2008 | Nelson et al. | 361/696 |

\* cited by examiner

*Primary Examiner* — Courtney Smith
(74) *Attorney, Agent, or Firm* — Altis Law Group, Inc.

(57) ABSTRACT

A container data center includes a movable container, two server systems having a cold aisle and two hot aisles, two fan apparatuses, an exchanger, and an air intake apparatus. The air intake apparatus includes a number of air intake elements each defining an air channel. The fan apparatuses are operable to transfer hot airflow in the hot aisles into the heat exchanger, and then the heat exchanger transforms the hot airflow into cold airflow and transfers the cold airflow into the cold aisle through the air intake apparatus. The air intake elements are connected together and cover the cold aisle. The air intake elements of the air intake apparatus are arranged in a "V" shape along an orientation toward the airflow of the cold aisle.

9 Claims, 5 Drawing Sheets

CONTAINER DATA CENTER AND AIR INTAKE APPARATUS

BACKGROUND

1. Technical Field

The present disclosure relates to data centers, and particularly to a container data center and an air intake apparatus of the container data center.

2. Description of Related Art

With increasing heavy duty use of on-line applications, the need for computer data centers has increased rapidly. Data centers are centralized computing facilities that include many servers, often arranged on server racks or shelves. In a common data center, cold airflow is provided to a cold aisle of the data center through an opening defined in the top of the data center, however, the cold airflow may become disorderly in the data center. Therefore, heat of some server systems may be not sufficiently dissipated, but heat of other server systems may be excessively dissipated.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
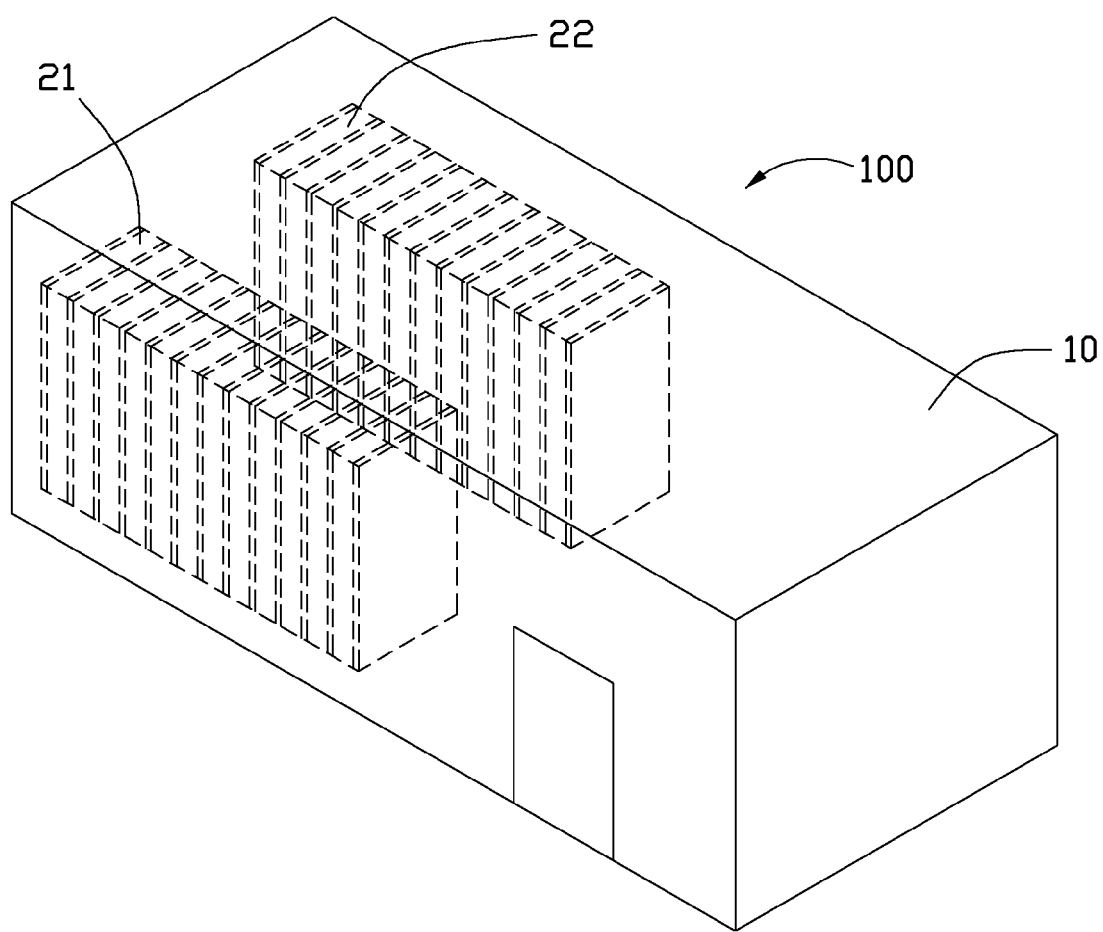
FIG. 1 is a schematic view of an embodiment of a container data center.

Referring to FIG. 1, an embodiment of a container data center 100 includes a container 10, and a first server system 21 and a second server system 22. In one embodiment, the container 10 is movable, and the first and second server systems 21 and 22 are installed in the container 10 in two parallel rows.

Figure 2:
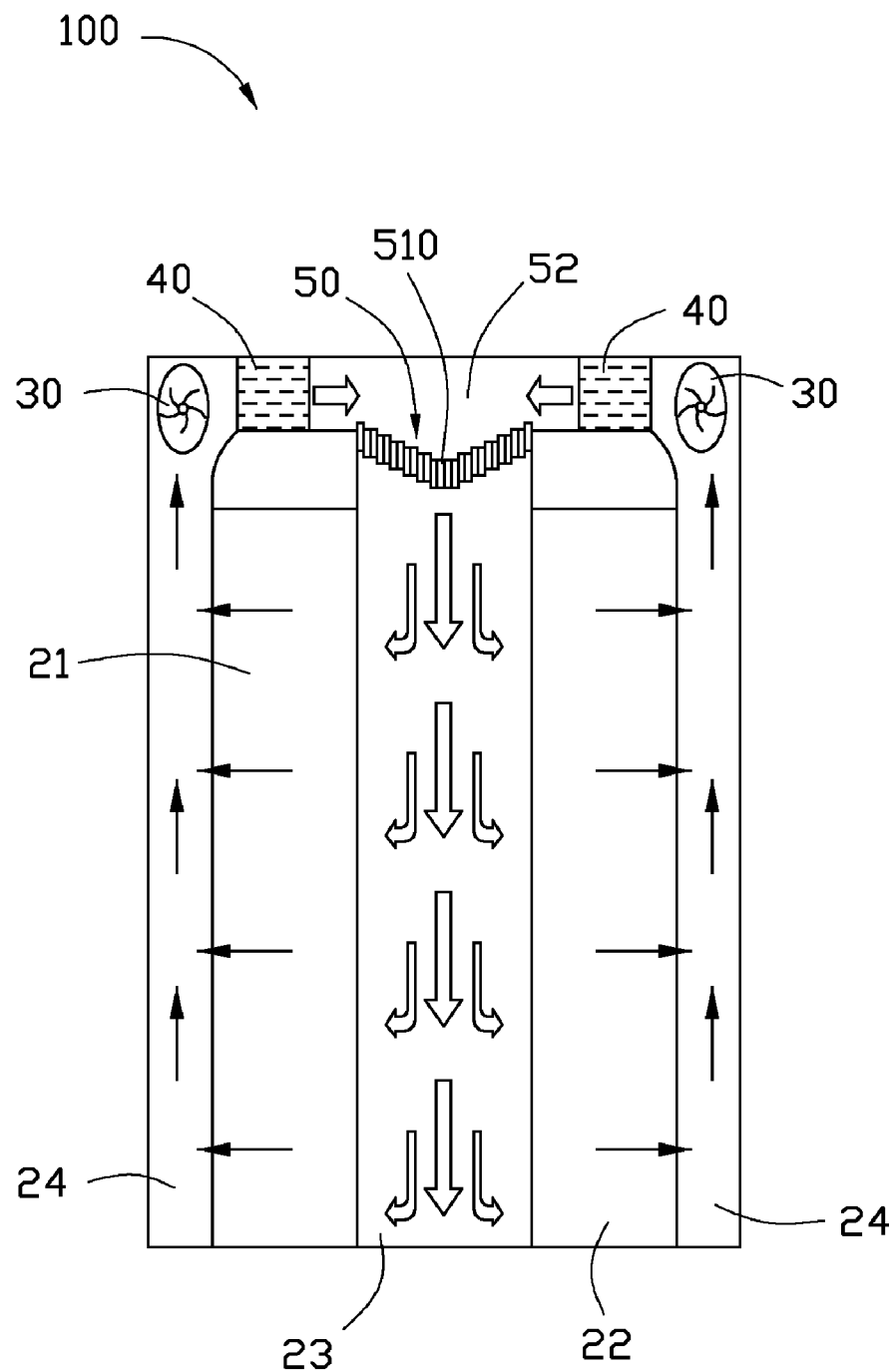
FIG. 2 is another schematic view of the data center of FIG. 1, the data center includes an air intake apparatus.

Referring to FIG. 2, the container data center 100 further includes two fan apparatuses 30 respectively mounted on two sides of the top of the container 10, two heat exchangers 40 respectively mounted on the first server system 21 and the second server system 22, and an air intake apparatus 50 arranged between the tops of the first and second server systems 21 and 22. The fan apparatuses 30 and the heat exchangers 40 fall within well-known technologies, and are therefore not described in detail here.

In the container data center 100, there are a cold aisle 23 defined between the first server system 21 and the second server system 22, two hot aisles 24 defined between opposite sidewalls of the container 10 and the corresponding first and second server systems 21 and 22, and a cold airflow collecting area 52 defined among the heat exchangers 40 and the air intake apparatus 50 (large hollow arrows, identified as an outlined white arrow, stand for cold airflow, and small solid arrows identified as a small black arrow, stand for hot airflow in FIG. 2). The fan apparatuses 30 located at the air outlet of the hot aisles 24 transfer hot airflow in the hot aisles 24 into the heat exchangers 40, and then the heat exchangers 40 located adjacent to the fan apparatuses 30 and opposite to the hot aisles 24 transform the hot airflow into cold airflow and transfer the cold airflow into the cold airflow collecting area 52. When the cold airflow collecting area 52 collects enough cold airflow, the cold airflow will enter the cold aisle 23 through the air intake apparatus 50 and dissipate heat for the first server system 21 and the second server system 22.

Figure 3:
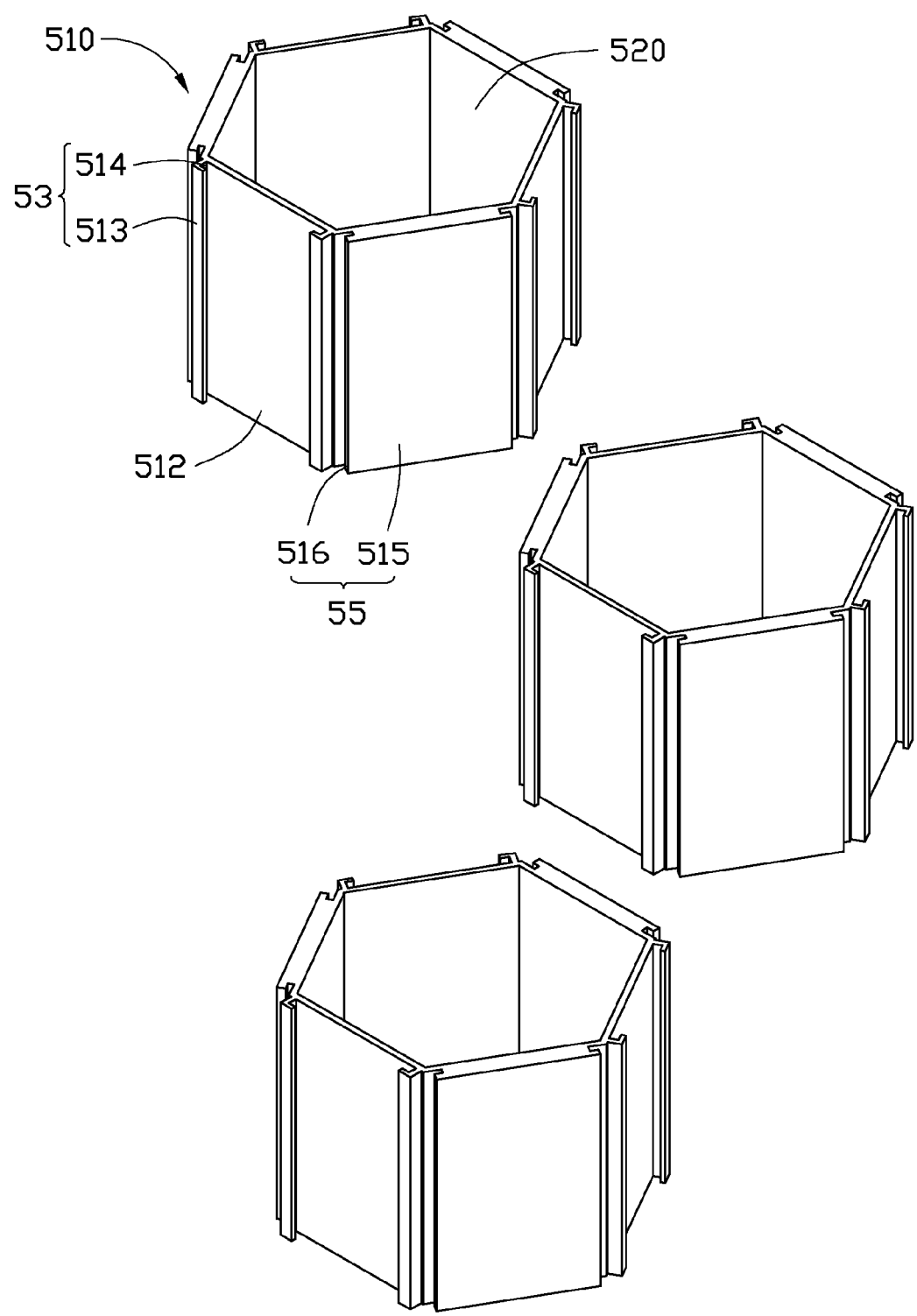
FIG. 3 is a partial, exploded, isometric view of the air intake apparatus of FIG. 2.

Referring to FIG. 3, the air intake apparatus 50 includes a number of air intake elements 510. The air intake elements 510 satisfy that the air intake elements 510 cover the top of the cold aisle 23. For easily understanding, only three air intake elements 510 are shown in FIG. 3.

Each air intake element 510 is a hollow regular hexagon column, and includes six sidewalls 512 bounding an air channel 520. Three first connecting elements 53 and three second connecting elements 55 alternately extend from the sidewalls 512. Each first connecting element 53 includes two L-shaped protrusions 513 extending from opposite sides of a corresponding sidewall 512. The protrusions 513 extend toward each other. A slot 514 is defined between the sidewall 512 and each protrusion 513. The second connecting element 55 includes a raised portion 515 having a T-shape in cross section. The raised portion 515 includes two arms 516 extending from opposite sides of the raised portion 515. The arms 516 of one air intake element 510 can be inserted into two slots 514 of a corresponding first connecting element 53 of another air intake element 510. In other embodiments, the sectional shape of the air intake element 510 can be designed to other kinds of shapes, such as rectangular. The first connecting element 53 and the second connecting element 54 can be designed to other matched configurations according to requirements.

Figure 4:
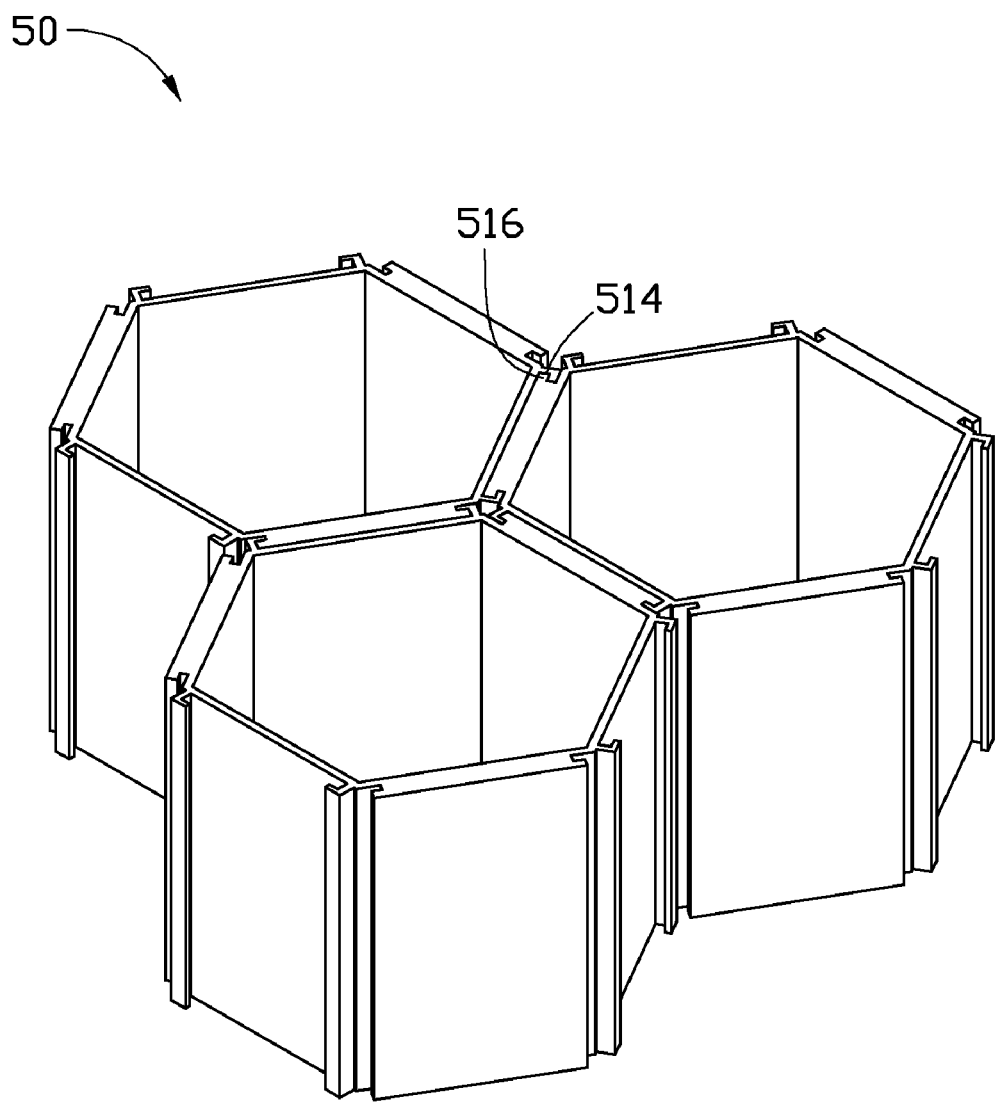
FIGS. 4 and 5 are assembling process views of FIG. 3.
Figure 5:
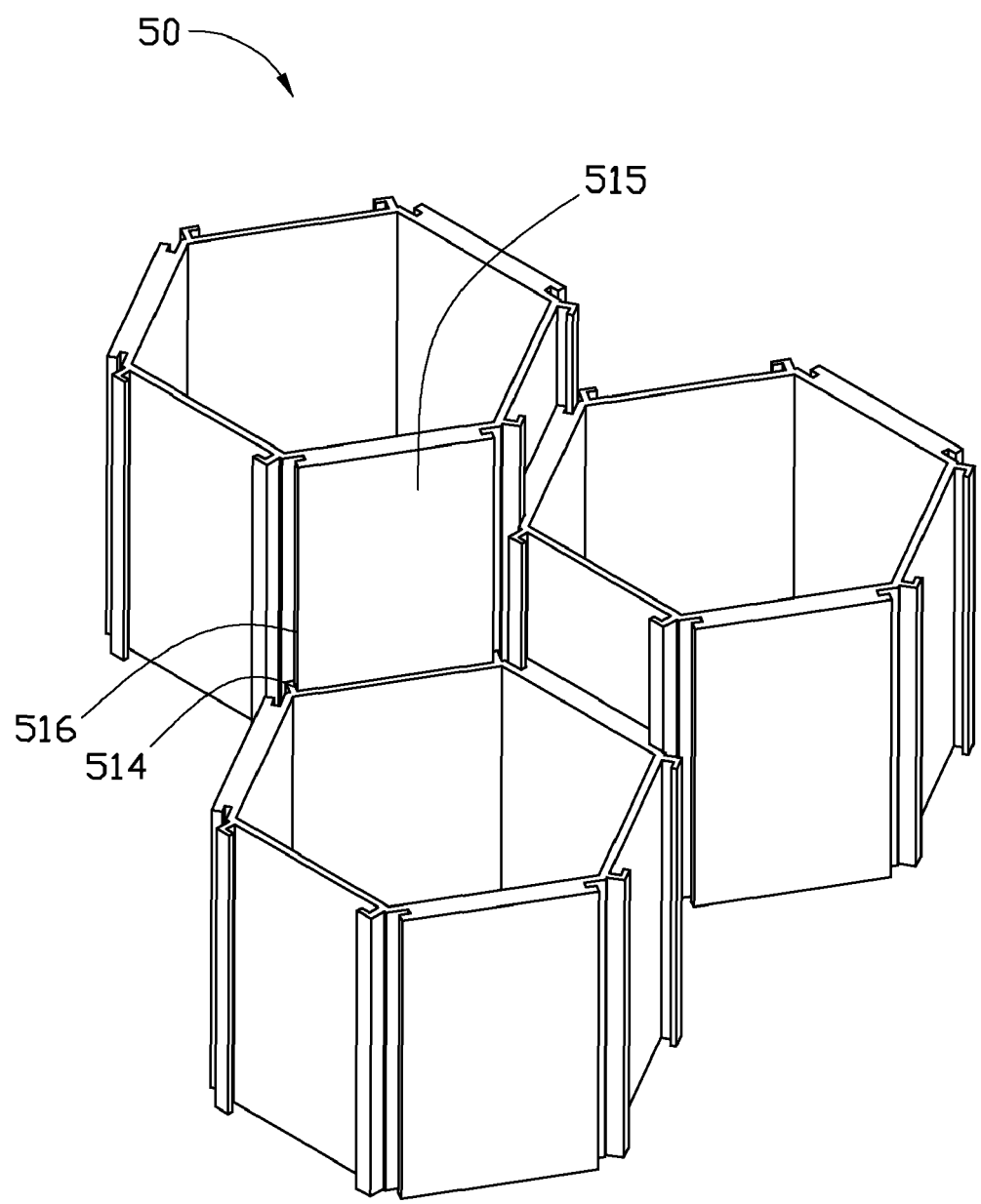

Referring to FIGS. 4-5, and FIG. 2, in assembling the air intake apparatus 50, all of the air intake elements 510 are connected together through the first connecting elements 53 being connected to the corresponding second connecting elements 55, shaped like a honey comb. Each two adjacent air intake elements 510 can be relatively slide about each other; therefore, the height of each air intake element 510 relative to an adjacent intake element 510 can be adjusted according to requirements.

In detail, the air intake elements 510 are connected together side by side in a gutter shape with a substantially V-shaped cross section (shown in FIG. 3). The cold airflow transferred from the air intake elements 510 which are positioned in the lowest position of the air intake apparatus 50 is controlled to exactly match the length of airflow to the cold aisle 23, which can dissipate heat for the lower levels of the first and second server systems 21 and 22. The cold airflow transferred from the air intake elements 510, which are positioned at the sides or upper level of the gutter-shaped air intake apparatus 50, does not need to reach the bottom of the container 10, but can dissipate heat for higher levels of the first and second server systems 21 and 22. Therefore, the cold airflow can be controlled to dissipate heat for the first and second server systems 21 and 22 in an optimal mode, which can increase efficiency and save electricity.

In one embodiment, the material of the air intake elements 510 are reflective material, which can increase brightness in the container 10 when a light (not shown) is turned on.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A container data center comprising:
    a movable container;
    two server systems installed on a bottom of the container in two parallel rows;
    a cold aisle defined between the two server systems, and two hot aisles defined between opposite sidewalls of the container and the server systems;
    two fan apparatuses respectively located at an air outlet of the hot aisles;
    an exchanger located adjacent to the fan apparatuses and opposite to the hot aisles; and
    an air intake apparatus connecting tops of the server systems, and comprising a plurality of air intake elements each defining an air channel directing cold airflow in the cold aisle;
    wherein the fan apparatuses are operable to transfer hot airflow in the hot aisles into the heat exchanger, and then the heat exchanger transforms the hot airflow into cold airflow and transfers the cold airflow into the cold aisle through the air intake apparatus; and
    wherein the plurality of air intake elements are connected together side by side in a gutter shape with a substantially V-shaped cross section to cover an air intake of the cold aisle, the convex side of the gutter shape faces the bottom of the container.

2. The container data center of claim 1, wherein every two adjacent air intake elements are operable to relatively slide about each other.

3. The container data center of claim 2, wherein each air intake element is a hollow regular hexagon column and comprises six sidewalls bounding the air channel, three first connecting elements and three second connecting elements alternately extend from the sidewalls, a first connecting element of an air intake element is operable to be slidably connected to a second connecting element of another air intake element.

4. The container data center of claim 3, wherein each first connecting element comprises two L-shaped protrusions extending from opposite sides of the corresponding sidewall, two opposite slots are defined between the protrusions and the corresponding sidewall, each second connecting element comprises a T-shaped raised portion having two arms extending from opposite sides of the raised portion, the arms of an air intake element is operable to be inserted into the corresponding slots of another air intake element.

5. The container data center of claim 1, wherein the plurality of air intake elements are made of reflective material.

6. An air intake apparatus used to transfer cold airflow into a cold aisle of a data center, the air intake apparatus comprising:
    a plurality of air intake elements each defining an air channel directing the cold airflow into the cold aisle;
    wherein the plurality of air intake elements are connected together in a gutter shape with a substantially V-shaped cross section to cover the cold aisle, a concave side of the gutter shape facing the cold airflow of the cold aisle;
    wherein every two adjacent air intake elements are operable to relatively slide about each other.

7. The air intake apparatus of claim 6, wherein each air intake element is a hollow regular hexagon column and comprises six sidewalls bounding the air channel, three first connecting elements and three second connecting elements alternately extending from the sidewalls, and one of the first connecting elements of an air intake element is operable to be slidably connected to one of the second connecting elements of another air intake element.

8. The air intake apparatus of claim 7, wherein each first connecting element comprises two L-shaped protrusions extending from opposite sides of the corresponding sidewall, two opposite slots are defined between the protrusions and the corresponding sidewall, each second connecting element comprises a T-shaped raised portion having two arms extending from opposite sides of the raised portion, the arms of an air intake element is operable to be inserted into the corresponding slots of another air intake element.

9. The air intake apparatus of claim 6, wherein the plurality of air intake elements are made of light reflective material.

\* \* \* \* \*